US010288645B2

(12) United States Patent
Audette et al.

(10) Patent No.: US 10,288,645 B2
(45) Date of Patent: May 14, 2019

(54) ORGANIC PROBE SUBSTRATE

(71) Applicant: INTERNATIONAL BUSINESS MACHINES CORPORATION, Armonk, NY (US)

(72) Inventors: David M. Audette, Colchester, VT (US); Sukjay J. Chey, Hartsdale, NY (US); Steven A. Cordes, Yorktown Heights, NY (US); Anthony D. Fortin, Shelburne, VT (US); David L. Gardell, Fairfax, VT (US); John R. Maher, Essex Junction, VT (US); Sankeerth Rajalingam, Peekskill, NY (US); Frederick H. Roy, III, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 514 days.

(21) Appl. No.: 14/755,733

(22) Filed: Jun. 30, 2015

(65) Prior Publication Data
US 2017/0003318 A1    Jan. 5, 2017

(51) Int. Cl.
*G01R 3/00* (2006.01)
*G01R 31/28* (2006.01)
*G01R 1/073* (2006.01)

(52) U.S. Cl.
CPC ........... *G01R 3/00* (2013.01); *G01R 1/07378* (2013.01); *G01R 31/2886* (2013.01)

(58) Field of Classification Search
CPC ..................................................... H05K 3/284

USPC ................................................... 361/749, 748
See application file for complete search history.

(56) References Cited

U.S. PATENT DOCUMENTS

| 7,084,651 | B2 | 8/2006 | Audette et al. | |
| 7,589,409 | B2* | 9/2009 | Gibson | H05K 1/112 257/686 |
| 8,933,717 | B2 | 1/2015 | Audette et al. | |
| 2002/0015256 | A1* | 2/2002 | Kadokura | G11B 17/0282 360/99.04 |
| 2012/0043113 | A1* | 2/2012 | Chien | H05K 1/0234 174/250 |
| 2012/0223293 | A1* | 9/2012 | Borenstein | B82Y 10/00 257/40 |
| 2013/0063917 | A1* | 3/2013 | Choi | H05K 3/3452 361/771 |
| 2013/0344694 | A1* | 12/2013 | Audette | G01R 1/06744 438/652 |

OTHER PUBLICATIONS

Specification and Drawings for U.S. Appl. No. 14/486,474, filed Sep. 15, 2014, not yet published, 32 pages.

* cited by examiner

*Primary Examiner* — Stanley Tso
(74) *Attorney, Agent, or Firm* — Michael LeStrange; Andrew M. Calderon; Roberts Mlotkowski Safran Cole & Calderon, P.C.

(57) ABSTRACT

An organic probe substrate structure includes a daughter card; an organic laminate attached to the daughter card; and multiple probes built onto a top surface of the organic laminate.

13 Claims, 3 Drawing Sheets

ORGANIC PROBE SUBSTRATE

FIELD OF THE INVENTION

The invention relates to semiconductor structures and, more particularly, to probe substrate structures.

BACKGROUND

Probe substrates are used for wafer level test of semiconductor devices. On a probe substrate structure, rigid probes are built on ceramic substrates using photolithography and metal plating processes. Rigid probes are suitable for testing wafers or diced chips that have solder balls. The compliance of the solder balls allows each probe to make electrical contact regardless of small variations in probe or solder ball heights. The substrate can be mounted in gimbaling hardware that allows the substrate to planarize itself to the wafer. Ceramic substrates may be relatively costly, provide a limited number of inputs/outputs, and exhibit excessive substrate deflection at high probe forces.

SUMMARY

In an aspect of the invention, a method may include attaching an organic laminate to a daughter card; planarizing a top surface of the organic laminate after attaching the organic laminate to the daughter card; and building a plurality of probes on top of the organic laminate.

In an aspect of the invention, an organic probe substrate structure may include a daughter card; an organic laminate attached to the daughter card; and multiple probes built onto a top surface of the organic laminate.

In an aspect of the invention, an organic probe substrate structure may include a daughter card having multiple through vias on a first pitch; multiple conductive balls attached to the daughter card at the plurality of through vias; and an organic laminate having multiple connecting vias on the first pitch on a bottom surface of the organic laminate. The multiple conductive balls may be attached to the organic laminate at the multiple connecting vias. The organic laminate may include multiple probe vias on a second pitch on a top surface of the organic laminate and connected to the connecting vias by a bridge. The second pitch may be less than the first pitch. The organic probe substrate structure may include multiple probes built onto the plurality of probe vias. The through vias, the connecting vias, the bridge, and the probe vias each include a conductive material. The multiple probes electrically contact the through vias through the multiple probe vias, the bridge, the connecting vias, and the multiple conductive balls.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

Figure 1:
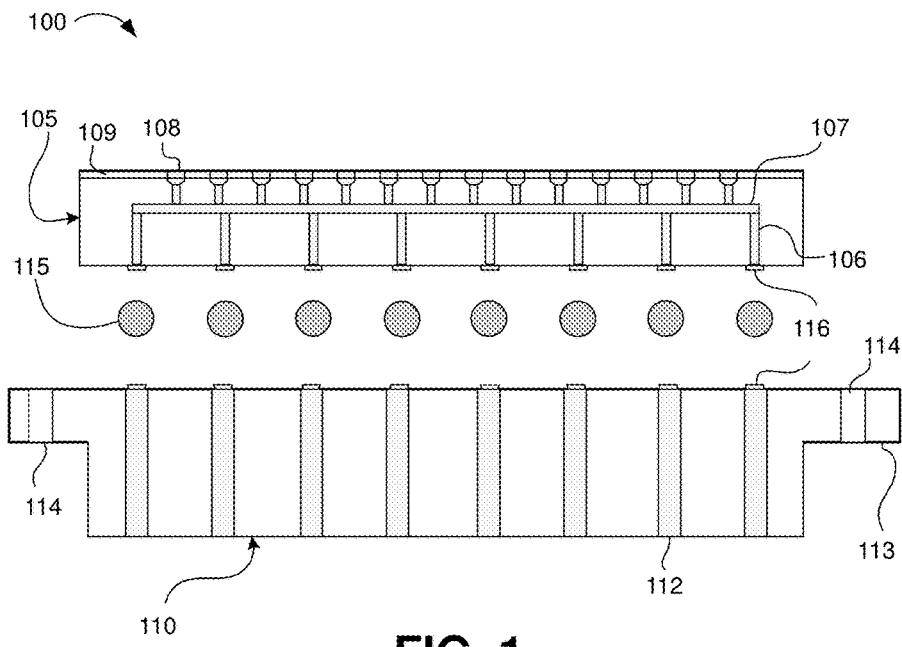
FIG. 1 shows an exploded front view of an organic probe substrate in accordance with aspects of the present invention.

The invention relates to semiconductor structures and, more particularly, to probe substrate structures. More specifically, the present invention relates to organic probe substrate structures.

An organic probe substrate structure may be substantially less expensive than ceramic probe substrate structures. Further, an organic probe substrate structure, in relation to a ceramic probe substrate structure, may be faster to design, machine and fabricate, exhibit increased electrical performance, e.g., less resistance within substrate planes, increase the density of probes for better current sharing, and exhibit lower deflection at higher probe loads. Advantageously, the present invention provides an organic probe substrate structure and a method of manufacture that provides the above advantages.

In embodiments, an organic probe substrate structure, in accordance with aspects of the present invention, includes, e.g., an organic daughter card and an organic laminate attached to the daughter card. The daughter card provides a "foundation" for the organic probe substrate structure, providing structural stiffness and strength to the structure. The daughter card is provided to improve stiffness and strength since the thickness of the organic laminate is limited to accommodate a greater number of probes in a given area. For example, the thickness of the organic laminate is inversely proportional to the number of probe vias, and proportional to the probe via pitch. In order to provide a higher number of probe vias in a given area, the organic laminate may be relatively thin, and thus, may have relatively low stiffness and a relatively high coefficient of thermal expansion (CTE). Therefore, the daughter card is attached to the organic laminate to provide additional structural stiffness and strength to prevent excess deflection when a load is applied to the organic probe substrate structure, e.g., during normal use. Further, the thickness of the daughter card may reduce the CTE of the organic probe substrate structure. In embodiments, the daughter card can be made thicker than that of a typical ceramic probe substrate structure.

As described herein, the daughter card may include through vias on an approximately 0.5 millimeter (mm) to 1 mm pitch. The organic laminate, on the other hand, acts as a space transformer to reduce the pitch of the vias of the daughter card, e.g., to approximately 50 to 185 micrometers, thereby accommodating a higher number of probes that can be built onto the organic laminate. Since the pitch of the vias of the daughter card is relatively large, the thickness of the daughter card may be larger than that of the organic laminate, thereby increasing the stiffness of the organic probe substrate structure.

In embodiments, the organic laminate is attached to the daughter card via copper balls, soldering paste, and filling material. During assembly, a reflow process may be used to attach the daughter card to the organic laminate. During the cooling portion of the reflow process, the top surface of the organic laminate experiences a warping effect where the top surface of the organic laminate is no longer flat, e.g., the top surface becomes concave or becomes another non-flat shape. Building probes on a concave or other type of non-flat surface is problematic, thus, the surface is planarized (e.g., flattened) so that the probes can be easily built onto the top surface of the organic laminate and the resulting probe flatness is functional. Accordingly, the organic laminate includes a sacrificial layer or layers on the top surface, which can be easily milled off to planarize the organic laminate without affecting the performance or properties of the organic probe substrate assembly while maintaining sufficient via metal for probe adhesion. Once flattened, rigid probes can be built onto the organic laminate surface using, for example, photo deposition processes. The organic probe substrate structure can be mounted in hardware, e.g., gimbaling hardware, and used for wafer level testing of semiconductor devices.

In embodiments, the top surface of the organic laminate after milling is substantially flat such that when the organic probe substrate structure is built, the contact is uniform between the probe pads on the bottom surface and the solder balls on the wafer. Test equipment is limited by the force that can be applied. This limits the number of C4s that can be contacted with probes. As the probe tips become more planar the average force per probe to make full electrical contact decreases. The uniform contact may thus eliminate the need to depopulate the pads to reduce force since manufacturing a probe assembly with substantially flat surface is substantially easier with an organic material because of easier machinability compared to ceramic. Moreover, the increased via density with the organic material of the daughter card and laminate will increase the vertical electric current delivery path through to the probe pads. The difference in the CTE between the organic substrate and wafer may result in desirable sideways force on the embedded probe tip as the assembly changes temperature during testing.

FIG. 1 shows an exploded front view of an organic probe substrate in accordance with aspects of the present invention. As shown, the organic probe substrate 100 may include organic laminate 105 and daughter card 110. As described herein, organic laminate 105 and daughter card 110 are attached via copper balls 115 and solder paste 116. Daughter card 110 may be formed from an organic material, and may include vias 112. Vias 112 may be filled with a conductive material, such as copper and/or another conductive material. Vias 112 may be straight through vias, and separated by approximately a 0.5 mm to 1 mm pitch, although the pitch can vary in different embodiments. Daughter card 110 may include a ledge 113 with fastening holes 114 from which organic probe substrate 100 may be mounted in hardware for wafer level testing. In practice, a fastening hole 114 may be provided on each side of ledge 113. Daughter card 110 may have a total thickness of approximately 6 mm, although the thickness may vary in different embodiments. The bottom of daughter card 110 may contact a pogo pin compliant interposer, e.g., when organic probe substrate 100 is mounted in hardware for wafer level testing. Solder paste may be provided at a top of daughter card 110, e.g., at vias 112. As described herein, copper balls 115 are attached to daughter card 110 via solder paste 116. In alternative embodiments, other materials may be used in place of copper for balls 115.

Organic laminate 105 may be formed from an organic material, and may include connecting vias 106, bridge 107, probe vias 108, and sacrificial layer or layers 109. Connecting vias 106 are filled with a conductive material, and may be separated by a pitch that corresponds to the pitch of vias 110. Bridge 107 represents the space transformation from Backside Metallurgy (BSM) to Topside Metallurgy (TSM) for all power and grounds as well as signals and is filled with a conductive material, and connects probe vias 108 to connecting vias 106. Probe vias 108 are filled with a conductive material, and form a surface onto which probes may be built, as described herein. Probe vias 108 are separated by a smaller pitch than that of connecting vias 106 and vias 112. For example, probe vias 108 may be separated by a pitch of approximately 50 micrometers to 185 micrometers. In embodiments, probe vias 108 may be tapered in shape with a diameter or width that is sufficiently large enough upon which probes may be built upon or attached to organic laminate 105. The thickness of organic laminate 105 may be approximately 2-3 mm, although this thickness may vary based on the pitch of probe vias 108 and the number of probe vias 108 for a given surface area of organic laminate 105. Solder paste may be provided at each of connecting vias 106. Copper balls 115 are attached to organic laminate 105 via solder paste 116. Organic laminate 105 and daughter card 110 are attached via copper balls 115. As described herein, a top of organic laminate 105 may warp during the attachment of organic laminate 105 to daughter card 110 or through other processing steps due to CTE mismatch of materials or differences in cooling rates. Sacrificial layer 109 is provided at the top of organic laminate 105 so that organic laminate 105 can be flattened after being warped during the attachment process.

Organic laminate 105 and daughter card 110 can be fabricated using conventional fabrication processes. For example, the organic probe substrate of the present invention can be manufactured in a number of ways using a number of different tools. In general, though, the methodologies and tools are used to form structures with dimensions in the micrometer and nanometer scale. The methodologies, i.e., technologies, employed to manufacture the organic probe substrate of the present invention have been adopted from integrated circuit (IC) and printed circuit board technology. For example, the structures of the present invention are realized in films of material patterned by photolithographic processes. In particular, the fabrication of the organic probe substrate of the present invention uses three basic building blocks: (i) deposition of thin films of material on a substrate, (ii) applying a patterned mask on top of the films by photolithographic imaging, and (iii) etching the films selectively to the mask.

As can be seen in FIG. 1, organic laminate 105 acts as a space transformer to reduce the pitch of probe vias 108 from the pitch of connecting vias 106 and 112, e.g., to increase the number of probes that can be built onto organic laminate 105. The pitch of vias 112 is larger than that of probe vias 108 such that daughter card 110 has a larger thickness than that of organic laminate 105, thereby increasing the overall strength and stiffness of organic probe substrate 100. As described herein, electrical contact is made between probe vias 108 and vias 112 through bridge 107, connecting vias 106, and copper balls 115.

Figure 2:
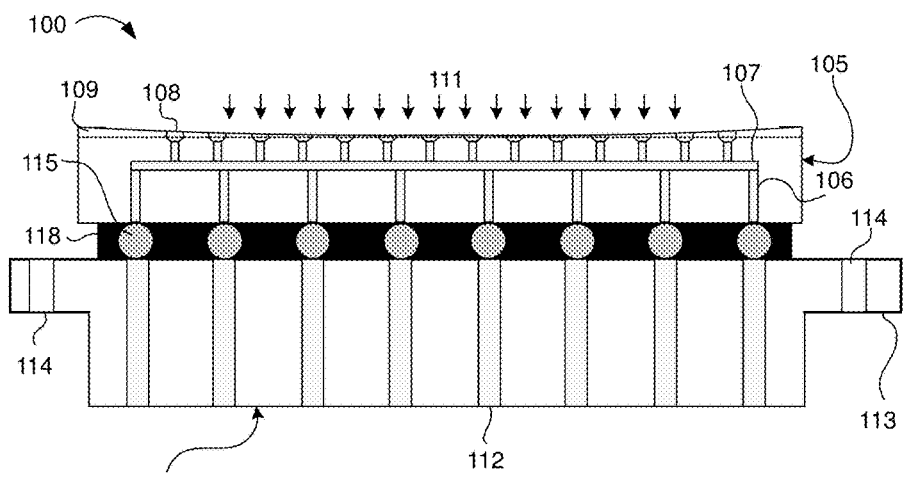
FIGS. 2, 3A, 3B, and 4 show manufacturing processes and respective structures in accordance with aspects of the present invention.

FIGS. 2, 3A, 3B, and 4 show manufacturing processes and respective structures in accordance with aspects of the present invention. As shown in FIG. 2, organic laminate 105 is attached to daughter card 110 via copper balls 115. For example, during assembly of organic probe substrate 100, solder paste 116 is applied to bottom portion of organic laminate 105, e.g., at each via 106. Copper balls 115 are attached to the bottom of organic laminate 105 via solder paste 116. Solder paste is provided at each of vias 112 on daughter card 110, and daughter card 110 is attached to copper balls 115. Once attached, a reflow soldering process may be used to permanently attach organic laminate 105 and daughter card 110 via copper balls 115. Further, a filling material 118 is provided to strengthen and protect the overall assembly, particularly the connections between organic laminate 105, daughter card 110, and soldering balls 115. Filling material 118 may include an epoxy resin, a polymer-captan, and/or other materials. Once assembled, electrical contact is made between probe vias 108 and vias 112 through bridge 107, connecting vias 106, and copper balls 115.

During the reflow process, organic probe substrate 100 is exposed to a substantial amount of heat to attach organic laminate 105 and daughter card 110 via copper balls 115. When organic probe substrate 100 is no longer exposed to heat, a top surface of organic laminate 105 may warp as organic laminate 105 cools due to CTE mismatch between the materials or a mismatch in the rate of cooling, as shown by arrows 111 in FIG. 2. For example, as shown in FIG. 2, the top surface of organic laminate 105 is concave and is no longer flat. In embodiments, a warping of approximately 60 micrometers to 70 micrometers may occur, e.g., a delta of 60 micrometers to 70 micrometers is present between the inflection point, e.g., bottom, of the concavity and edges of organic laminate 105.

Figure 3A:
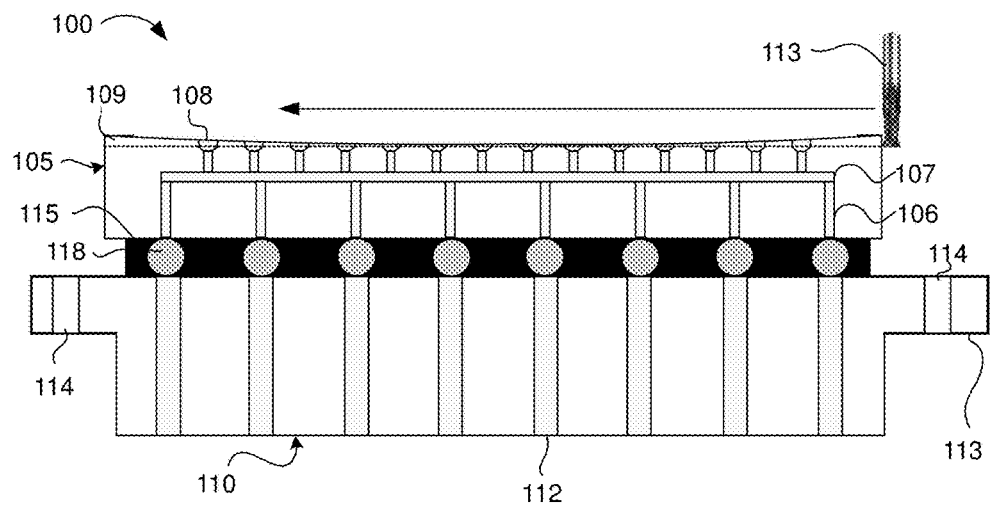
Figure 3B:
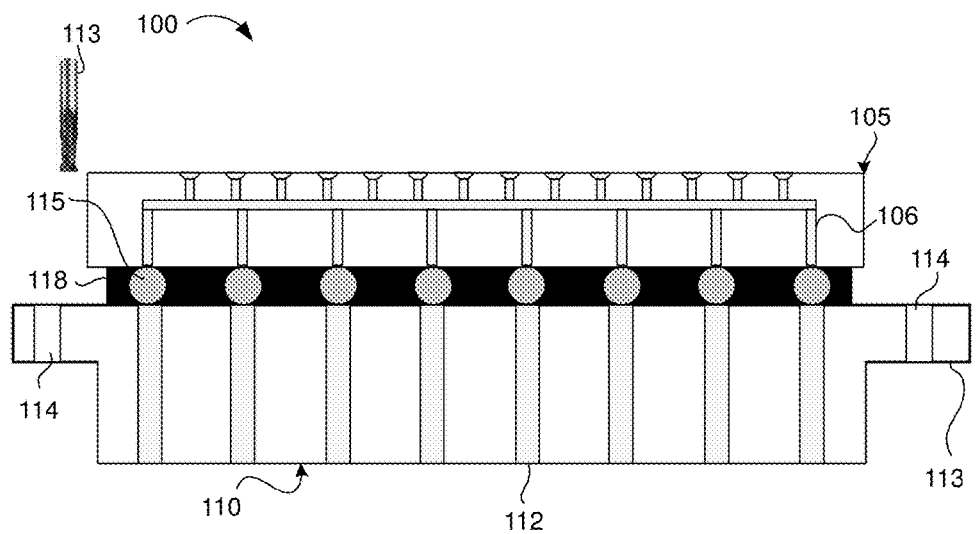

As shown in FIGS. 3A and 3B, a portion of sacrificial layer 109 is milled, e.g., using milling tool 113, to a depth of the inflection point of the concavity to regain the flatness of the top surface of organic laminate 105. As shown in FIG. 3B, the flatness of organic laminate 105 is regained, while sufficient diameter or width of probe vias 108 is maintained for probes to be attached. In this regard, the height of probe vias 108 during construction of organic laminate 105 may be such that sufficient diameter or width remains after organic laminate 105 has been milled to regain flatness. In embodiments, a small portion of sacrificial layer 109 may remain after the milling process. In embodiments, a small concavity may remain after the milling process, however, the delta between the top surface of organic laminate 105 and the point of inflection on the concavity may be 5 micrometers or less. Once organic laminate 105 has been flattened as described herein, probes may be built upon or attached to organic laminate 105.

Figure 4:
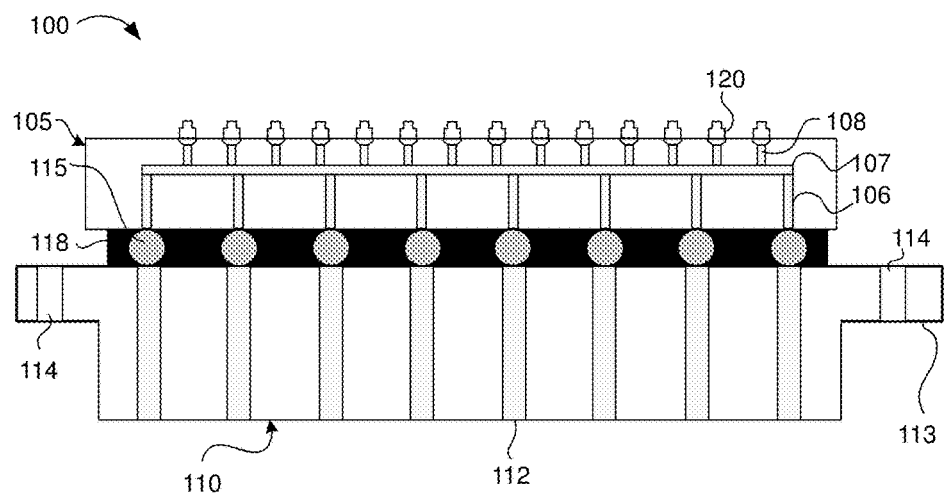

As shown in FIG. 4, probes 120 may be attached to vias 108 using photo deposition processes. Once probes 120 have been attached, electrical contact is made between probes 120 and vias 112, and further, to an interposer contacting the bottom of daughter card 110 when organic probe substrate 100 is mounted in wafer testing hardware. In embodiments, multiple organic laminates 105 may be attached to the top of daughter card 110, e.g., for multiple Device Under Test (DUT) applications. In embodiments, a particular organic laminate design may be used in the final part package, greatly reducing design time and part cost due to high volumes.

Figure 5:
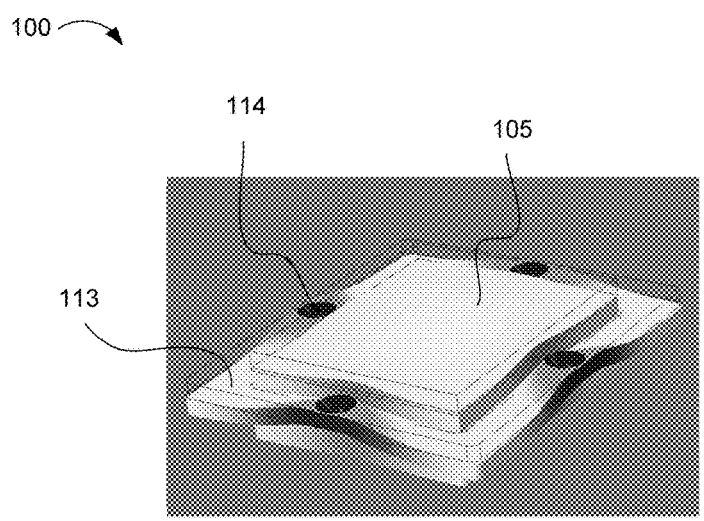
FIG. 5 shows a perspective view of an organic probe substrate structure in accordance with aspects of the present invention.

FIG. 5 shows a perspective view of a simulation of an organic probe substrate structure in accordance with aspects of the present invention. For clarity, various components of organic probe substrate 100 are not shown in FIG. 5. Organic probe substrate 100 can be mounted to hardware via fastening holes 114 which are provided on each ledge towards a middle thereof. Organic probe substrate 100 is supported by the mounting hardware only in the area of these screw holes. This can be accomplished with a shaped gasket or raised area on either organic probe substrate 100 or mounting hardware. The simulation of FIG. 5 shows that allowing the corners of organic probe substrate 100 to be unsupported results in reduced deflection under probing loads. For example, the deflection at organic laminate 105 may be less than 10 micrometers when a load of approximately 450 pounds is applied.

The load applied to the substrate to successfully probe wafers with a rigid probe system will depend on several factors including the geometry of the probes, uniformity of the size of the C4 balls on the wafer, hardness of the C4 balls, deflection of the probe substrate and wafer and how parallel the substrate is to the wafer. Aspects of the present invention will most advantageously be used with a gimbaling probe assembly. As an example, 450 lb may be required to probe 15,000 C4s with 25 micrometer diameter tips and proportionally less force will be required with 20 or 14 um diameter tips.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An organic probe substrate structure comprising:
a daughter card including a plurality of through vias on a first pitch;
an organic laminate attached to the daughter card via a plurality of solder connections; and
a plurality of probes built directly onto a top planar surface of the organic laminate;
wherein the organic laminate includes a plurality of probe vias on a second pitch connected to a plurality of connecting vias on a third pitch by a bridge, the connecting vias contacting the plurality of solder connections,
the first pitch is the same as the third pitch, and the second pitch is less than the first pitch and the third pitch,
the plurality of probes electrically contact the through vias through the plurality of probe vias, the bridge, the connecting vias, and a plurality of balls, and
the daughter card includes a ledge on each side, each of which includes a fastening hole, wherein when mounted, the structure is unsupported at corners of the structure.

2. The structure of claim 1, wherein the plurality of solder connections are provided between the organic laminate and the daughter card.

3. The structure of claim 2, further comprising filling material provided in between the daughter card and the organic laminate and around the plurality of solder connections.

4. The structure of claim 2, wherein
the plurality of probes are built on the plurality of probe vias.

5. The structure of claim 1, wherein the daughter card is organic.

6. The structure of claim 1, wherein the plurality of probes are built directly onto the top planar surface of the organic laminate.

7. The structure of claim 1, wherein the plurality of probes are built above a respective plurality of probe vias.

8. The structure of claim 7, wherein the respective plurality of probe vias are connected to a plurality of connecting vias by a bridge.

9. An organic probe substrate structure comprising:
a daughter card having a plurality of through vias on a first pitch;
a plurality of balls attached to the daughter card at the plurality of through vias;
an organic laminate having a plurality of connecting vias on the first pitch on a bottom surface of the organic laminate, the plurality of balls attached to the organic laminate at the plurality of connecting vias, the organic laminate further comprising a plurality of probe vias on a second pitch on a top surface of the organic laminate and connected to the connecting vias on a third pitch by a bridge, the first pitch being the same as the third pitch, and the second pitch being less than the first pitch and the third pitch; and
a plurality of probes built onto the plurality of probe vias and directly on a top planar surface of the organic laminate,
wherein the through vias, the connecting vias, the bridge, and the probe vias each comprise a conductive material,
wherein the plurality of probes electrically contact the through vias through the plurality of probe vias, the bridge, the connecting vias, and the plurality of balls, and
wherein the daughter card includes a ledge on each side, each of which includes a fastening hole, wherein when mounted, the structure is unsupported at corners of the structure.

10. The structure of claim 9, wherein the daughter card is organic.

11. The structure of claim 9, wherein the plurality of probes are built onto a planar surface.

12. The structure of claim 11, wherein the plurality of probes are built directly onto the planar surface.

13. The structure of claim 9, wherein the plurality of through vias are within the daughter card.

* * * * *